(12) United States Patent
Varnica et al.

(10) Patent No.: US 8,209,582 B1
(45) Date of Patent: Jun. 26, 2012

(54) SYSTEMS AND METHODS FOR OPTIMIZING A PRODUCT CODE STRUCTURE

(75) Inventors: Nedeljko Varnica, Sunnyvale, CA (US); Xueshi Yang, Sunnyvale, CA (US); Zining Wu, Los Altos, CA (US)

(73) Assignee: Marvell International Ltd., Hamilton (BM)

( * ) Notice: Subject to any disclaimer, the term of this patent is extended or adjusted under 35 U.S.C. 154(b) by 1107 days.

(21) Appl. No.: 11/935,866

(22) Filed: Nov. 6, 2007

Related U.S. Application Data

(60) Provisional application No. 60/864,671, filed on Nov. 7, 2006.

(51) Int. Cl.
*H03M 13/00* (2006.01)

(52) U.S. Cl. ....................................... 714/755

(58) Field of Classification Search ................... 714/755, 714/784
See application file for complete search history.

(56) References Cited

U.S. PATENT DOCUMENTS

| | | | | |
|---|---|---|---|---|
| 5,699,369 A | * | 12/1997 | Guha | 714/774 |
| 5,872,798 A | * | 2/1999 | Baggen et al. | 714/755 |
| 6,038,696 A | * | 3/2000 | Chouly et al. | 714/786 |
| 6,161,209 A | * | 12/2000 | Moher | 714/780 |
| 6,457,156 B1 | * | 9/2002 | Stenfort | 714/785 |
| 6,606,718 B1 | * | 8/2003 | Bessios | 714/701 |
| 6,725,411 B1 | * | 4/2004 | Gerlach et al. | 714/755 |
| 6,898,757 B1 | * | 5/2005 | Zhong et al. | 714/794 |
| 7,137,060 B2 | * | 11/2006 | Yu et al. | 714/794 |
| 7,178,080 B2 | * | 2/2007 | Hocevar | 714/752 |
| 7,254,769 B2 | * | 8/2007 | Kim et al. | 714/774 |
| 7,310,767 B2 | * | 12/2007 | Desai et al. | 714/782 |
| 7,331,012 B2 | * | 2/2008 | Vasic et al. | 714/781 |
| 7,428,203 B2 | * | 9/2008 | Kashihara et al. | 369/53.35 |
| 7,493,551 B2 | * | 2/2009 | Berens et al. | 714/790 |
| 7,502,987 B2 | * | 3/2009 | Kyung et al. | 714/781 |
| 7,587,654 B2 | * | 9/2009 | Matsumoto | 714/758 |
| 7,640,462 B2 | * | 12/2009 | Lin | 714/701 |
| 7,669,103 B2 | * | 2/2010 | Soljanin et al. | 714/751 |
| 7,673,221 B2 | * | 3/2010 | Li et al. | 714/774 |
| 7,694,208 B2 | * | 4/2010 | Ball | 714/784 |
| 7,814,398 B2 | * | 10/2010 | Djurdjevic et al. | 714/784 |
| 7,890,844 B2 | * | 2/2011 | Jeong et al. | 714/784 |
| 2006/0156171 A1 | * | 7/2006 | Kuznetsov et al. | 714/755 |
| 2009/0217130 A1 | * | 8/2009 | Myung et al. | 714/752 |

* cited by examiner

*Primary Examiner* — James C Kerveros

(57) ABSTRACT

Systems and methods for jointly optimizing various parameters of an error-correction code (e.g., a product code or other multi-dimensional code) are provided. In certain embodiments, joint optimization of coverage assignments, configuration assignments, rate assignments, and/or user data length assignments of an error-correction code is performed so as to achieve desired error-protection performance at minimized implementation complexity. In certain embodiments, coverage assignments of an error-correction code are optimized to achieve a desired performance level with minimized implementation complexity.

23 Claims, 11 Drawing Sheets

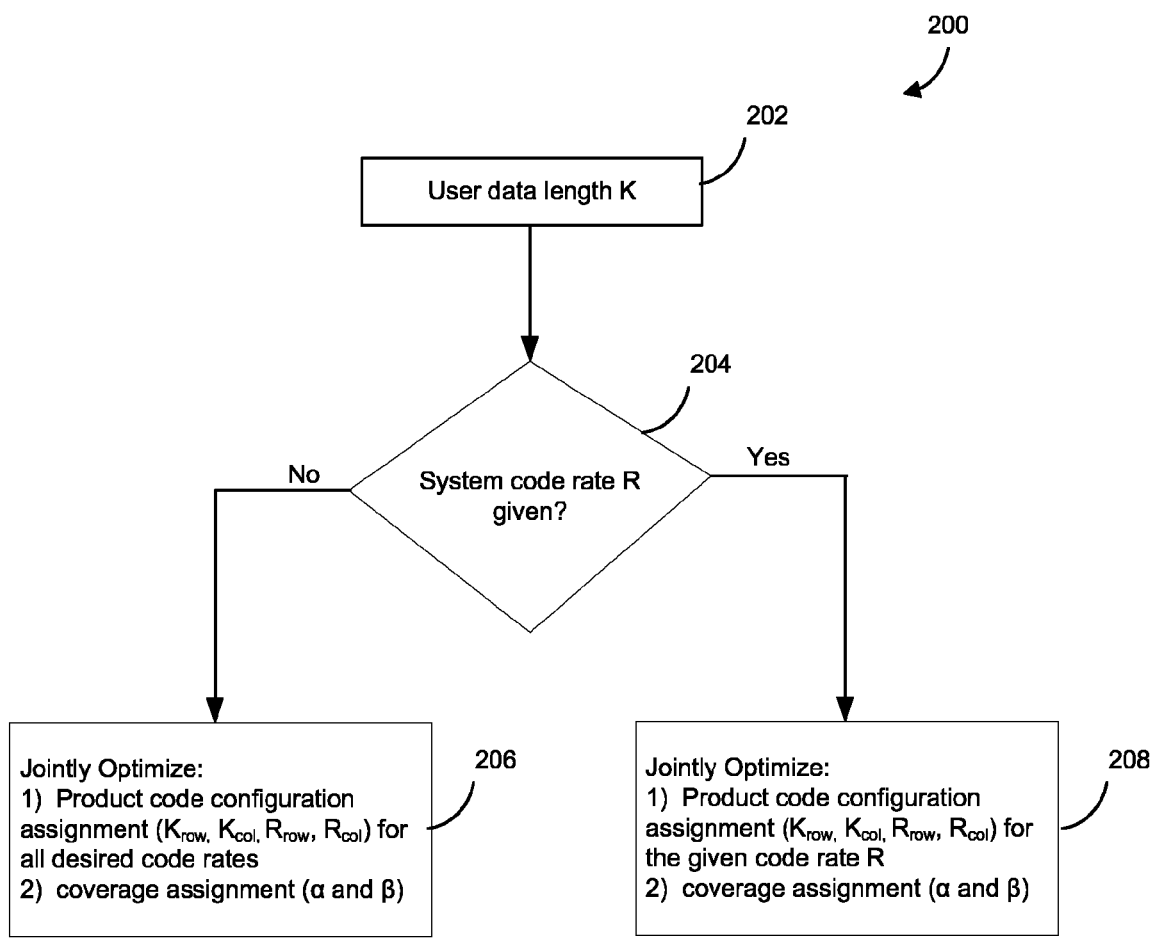

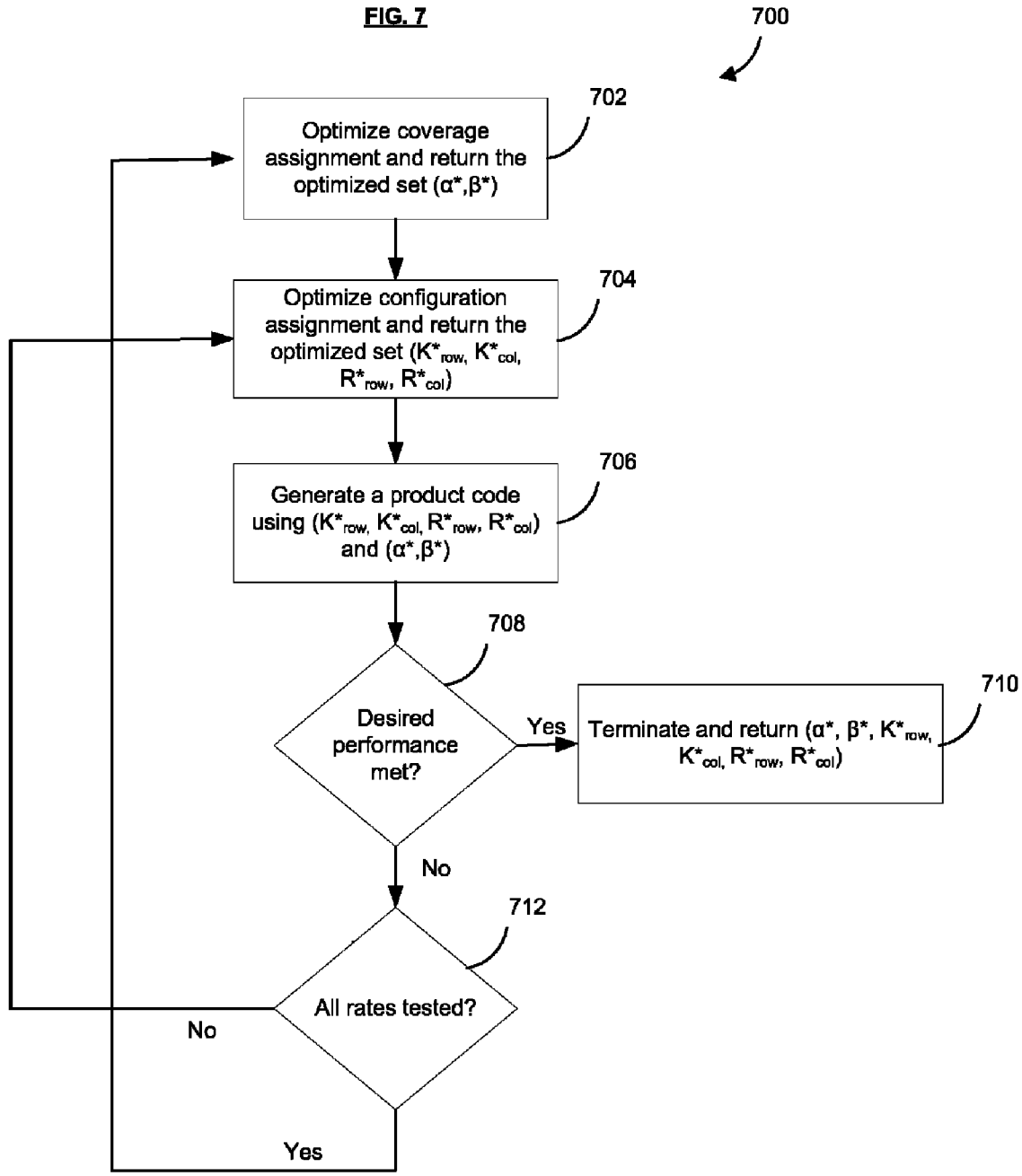

SYSTEMS AND METHODS FOR OPTIMIZING A PRODUCT CODE STRUCTURE

CROSS-REFERENCE TO RELATED APPLICATION

This application claims the benefit of provisional application No. 60/864,671, filed Nov. 7, 2006, which is hereby incorporated by reference herein in its entirety.

BACKGROUND

This application relates to data encoding and, more particularly, to data encoding in relation to error correction.

Electronic information is increasingly being relied upon as a preferred medium for conducting transactions. Advances in this area of technology are apparent in telecommunication and information storage devices, where developments in throughput and storage density are allowing users to process information at much greater rates and quantities than before.

Many communications and storage devices include error-correction technologies that provide a certain degree of data integrity across, for example, noisy channels or less-than-reliable storage media. In a typical error-correction process, a transmitter encodes user data with an error-correction code and sends the resulting code to a receiver from which the received information is decoded to recover the original user information. The encoding process ensures that the error-correction code conforms to specific rules of construction and departures from this construction may be automatically detected and, in some instances, corrected during the decoding process. Hence, the original user data is generally recoverable from the transmitted signal even when portions of the data are altered or deleted during transmission.

User data is typically grouped into blocks called "datawords." An error-correction code is a mapping of datawords into corresponding blocks called "codewords." In turn, the datawords and codewords contain symbols, which are groupings of one or more bits. The number of symbols in a dataword is commonly denoted by a variable k, and the number of symbols in a codeword is commonly denoted by a variable n. An encoder generally produces a greater number of codeword symbols than dataword symbols so that, for a codeword having k data bits, the remaining n–k parity bits may be used to detect and, in some instances, correct the data bits in the case that an error occurs. A code corresponding to such an encoder is said to have a code rate r of k/n.

In certain instances, code rates, along with code complexity, influence error-correcting capabilities of a particular coding scheme. A high code rate means information content is relatively high and coding overhead is relatively low. However, the fewer bits used for coding redundancy or parity, the less error protection is provided. At the same time, decoding cost increases significantly with user data length k. This increase may lead to, for example, a transmission failure if a piece of needed information cannot be provided in time due to delays incurred in decoding the information. Additionally, an increase in the data length k can require increased cost (e.g., area and power consumption) on a chip if throughput is to be substantially preserved.

In view of the forgoing, it would be desirable to provide systems and methods for optimizing various configuration parameters of an error-correction code so as to minimize its decoding complexity while maintaining a desired level of error protection.

SUMMARY

In accordance with this invention, techniques for jointly optimizing various parameters of an error-correction code are provided. In some embodiments of the invention, the error-correction code can be a product code or other multi-dimensional code. In some embodiments of the invention, the parameters of the code can include any one or more of a coverage assignment, a user data length (e.g., for a row or column in the case of a product code), and a system code rate. Further illustrative details of codes and parameters that can be used in embodiments of the present invention are provided below.

In one embodiment of the invention, systems and methods are provided for optimizing coverage values of an error-correction code. At least one parameter of the error-correction code is specified, and a set of coverage assignments is generated, where each coverage assignment includes at least a first coverage value and a second coverage value. Coverage assignments are iteratively selected from the set of coverage assignments, and for each selected assignment, an error-correction code is generated based on the selected assignment as well as the at least one parameter. The performance of the error-correction code is compared with a desired performance level, and if the desired performance level is satisfied, the selected coverage assignment is returned. In addition, the iterative selection of coverage assignments from the plurality of coverage assignments is terminated upon the return of the selected coverage assignment.

In another embodiment of the invention, systems and methods are provided for optimizing a configuration assignment associated with an error-correction code. At least one parameter for the error-correction code is specified, and a set of configuration assignments is formulated based on the at least one parameter, where each configuration assignment includes at least a first user data length, a second user data length, a first data rate and a second data rate. A currently optimal configuration assignment is also initialized from the set of assignments. Configuration assignments are iteratively selected from the set of configuration assignments, and for each selected assignment, a first error-correction code is generated based on the selected assignment. The performance of the first error-correction code is compared with the performance of a second error-correction code generated from the currently optimal configuration assignment. If the performance of the first code is better than the performance of the second code, the currently optimal configuration assignment is updated to be the same as the selected assignment. The currently optimal configuration assignment may be returned after all the configuration assignments have been iteratively selected.

In yet another embodiment of the invention, a system can include a plurality of memory cells and a memory controller coupled to the plurality of memory cells. The memory controller can be operable to encode data read from the plurality of memory cells using a product code configuration assignment. The system can also include circuitry coupled to the memory controller, the circuitry being operable to optimize at least one of the product code and transmit the at least one parameter to the memory controller for use in the data encoding.

The invention advantageously provides optimization techniques that allow an error-correction code to be appropriately configured in order to achieve a desired level of performance with minimized implementation complexity.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which:

FIG. 6 is a flow diagram showing an illustrative process for jointly optimizing a configuration assignment and a coverage assignment of a product code in accordance with the invention;

FIG. 7 is a flow diagram showing another illustrative process for jointly optimizing a configuration assignment and a coverage assignment of a product code in accordance with the invention;

DETAILED DESCRIPTION

Figure 1A:
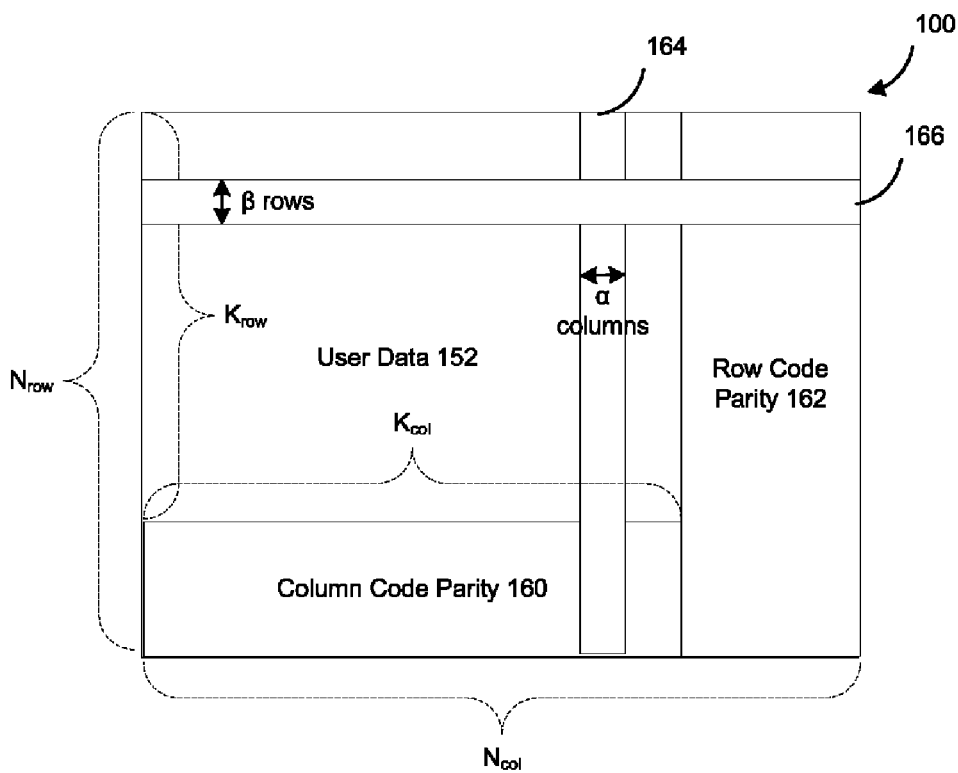
FIG. 1a is an exemplary product code structure.
Figure 1B:
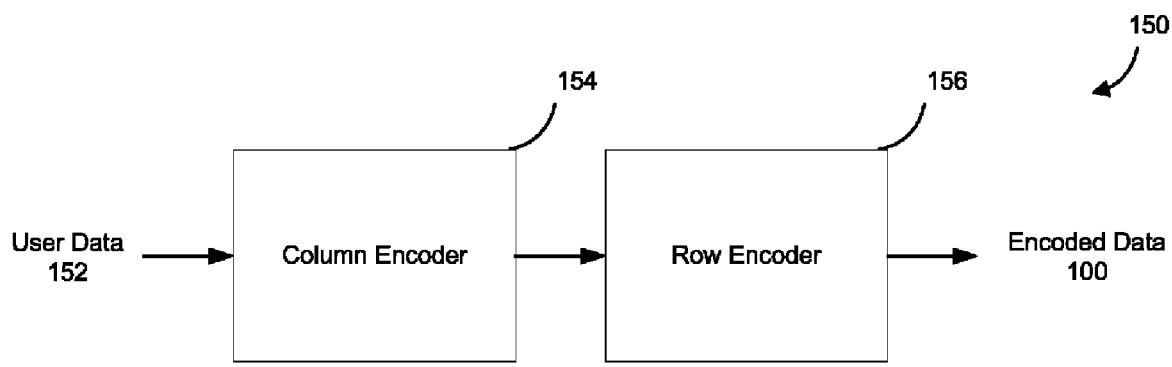
FIG. 1b is a block diagram showing an illustrative encoder architecture.

FIG. 1a shows an exemplary two-dimensional error-correction code structure 100, commonly referred to as a "product code", on which optimization techniques of the present invention are illustrated. However, the optimization techniques described herein may be generalized to error-correction codes of any number of dimensions. In certain instances, a multi-dimensional code, such as the two-dimensional product code structure 100 of FIG. 1a, is preferable over a long one-dimensional code structure having the same user data length K because the multi-dimensional code tends to be easier to decode than its one-dimensional counterpart. FIG. 1b shows an exemplary encoding architecture 150 that is used to produce product code structure 100 of FIG. 1a. As depicted, encoding architecture 150 includes column encoder 154 and row encoder 156. In operation, user data 152 of length K is supplied to the input of column encoder 154 and is encoded column-wise at column encoder 154 to generate a $N_{row} \times K_{col}$ two-dimensional output array. This output array is then provided to the input of row encoder 156 and further encoded row-wise at row encoder 156 to produce a $N_{row} \times N_{col}$ product code structure 100. As shown in detail in FIG. 1a, product code 100 includes $K_{row} \times K_{col}$ bits of user data 152, where $K_{row}$ and $K_{col}$ denote a row user data length and a column user data length, respectively, of structure 100. In addition, $K_{row} \times K_{col}$ is denoted as K. Product code 100 also includes $(N_{row} - K_{row}) \times K_{col}$ bits of column check parity 160 and $K_{row} \times (N_{col} - K_{col})$ bits of row check parity 162.

With continued reference to product code structure 100 of FIG. 1a, the first $K_{col}$ columns of structure 100 include one or more column codewords of user data 152. Similarly, the first $K_{row}$ rows of structure 100 include one or more row codewords of user data 152. Each column codeword and row codeword may in turn occupy one or more columns 164 and rows 166, respectively, of structure 100. In particular, the number of columns covered by a column codeword, referred to herein as a "column coverage value," is denoted by a variable $\alpha$. Similarly, the number of rows covered by a row codeword, referred to herein as a "row coverage value," is denoted by a variable $\beta$. Hence, the number of column codewords for structure 100 is defined as $N_{col}/\alpha$, and the number of row codewords is defined as $N_{row}/\beta$. Coverage values $\alpha$ and $\beta$ will be collectively referred to herein as a "coverage assignment" of a product code.

In addition, a row code rate $R_{row}$ of the product code is defined as $K_{row}/N_{row}$, a column code rate $R_{col}$ is defined as $K_{col}/N_{col}$, and a system code rate R is defined as $R_{row} \times R_{col}$. Configuration parameters $K_{row}$ and $K_{col}$ will be collectively referred to herein as a "user data length assignment" of the product code. Configuration parameters $R_{row}$ and $R_{col}$ will be collectively referred to herein as a "rate assignment" of the product code. Furthermore, the user data length assignment and rate assignment of a product code, i.e., parameters $K_{row}$, $K_{col}$, $R_{row}$ and $R_{col}$, will be collectively referred to herein as a "configuration assignment" of the product code.

It will be noted that each of column code parity 160 and row code parity 162 can be generated using any suitable code, including any one of the following: Reed-Solomon code; Bose, Ray-Chaudhuri, Hocquenghem ("BCH") code; convolutional code; low-density parity check ("LDPC") code; and Turbo code. It will also be noted that the code used to generate column code parity 160 can be different from the one used to generate row code parity 162.

Figure 2:
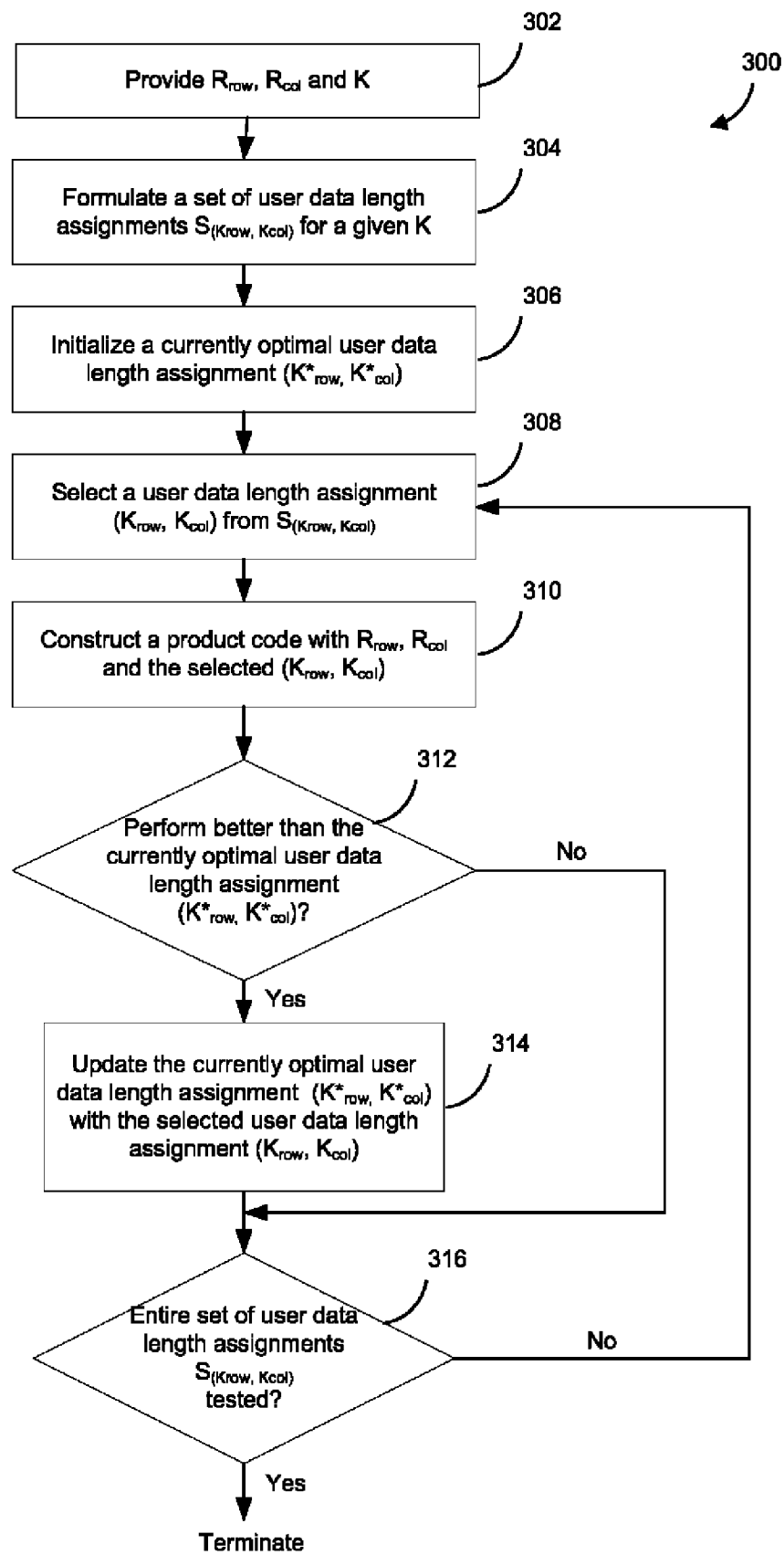
FIG. 2 is a flow diagram showing an illustrative process for optimizing a user data length assignment of a product code in accordance with the invention.

According to one embodiment of the present invention as shown in FIG. 2, an exemplary process 300 is provided for determining an optimal user data length assignment of a product code structure, such as structure 100 of FIG. 1a. Process 300 starts at step 302 by receiving, as inputs, user data length K, row code rate $R_{row}$, and column code rate $R_{col}$. Process 300 then proceeds to step 304 to formulate a set of user data length assignments $S_{(Krow, Kcol)}$ from which the optimal user data length assignment will be chosen. In one embodiment, $S_{(Krow, Kcol)}$ is formulated such that each user data length assignment $(K_{row}, K_{col})$ in $S_{(Krow, Kcol)}$ satisfies the condition that $K_{row} \times K_{col} = K$. For example, if K is 28 KB, then $S_{(Krow, Kcol)}$ may be the set $\{(1, 28 \text{ KB}), (2, 14 \text{ KB}), (4, 7 \text{ KB})\}$. In other examples, assignments in $S_{(Krow, Kcol)}$ may be formulated according to application or hardware constraints of the system used to transmit the product code.

The optimal user data length assignment may be chosen from $S_{(Krow, Kcol)}$ using an iterative procedure. For instance, at step 306 of FIG. 2, process 300 initializes a currently optimal user data length assignment $(K^*_{row}, K^*_{col})$ from $S_{(Krow, Kcol)}$. Process 300 then selects, at step 308, another user data length assignment $(K_{row}, K_{col})$ from the set $S_{(Krow, Kcol)}$ and utilizes the selected assignment, along with $R_{row}$ and $R_{col}$ provided at step 302, to produce a product code at step 310. Process 300 further compares, at step 312, performance of the product code with performance of a second product code constructed using the currently optimal user data length assignment $(K^*_{row}, K^*_{col})$. In one exemplary implementation, the performance of a product code is evaluated based on its error rate generated at a given signal-to-noise ratio (SNR). Hence, when comparing the performance of two product codes, the product code that is associated with a lower error rate for the given SNR is deemed to have better performance. The performance of a product code can also be evaluated using other user-selectable criteria such as defect detection capability, defect correction capability, erasure correction capability, and speed of convergence (e.g., for iterative codes, such as turbo and LDPC codes). As shown in FIG. 2, if the performance of the product code constructed from the user data length assignment selected at step 308 is better than that of the product code constructed from $(K^*_{row}, K^*_{col})$, then $(K^*_{row}, K^*_{col})$ is updated at step 314 to be the same as the selected assignment, and process 300 proceeds to step 316. Alternatively, if the performance of the product code constructed from $(K^*_{row}, K^*_{col})$ is better, process 300 proceeds to step 316 without updating $(K^*_{row}, K^*_{col})$.

At step 316, process 300 determines if every assignment of $S_{(Krow, Kcol)}$ has been evaluated. If that is indeed the case, process 300 terminates. Otherwise, process 300 iterates to step 308 to select a different user data length assignment from $S_{(Krow, Kcol)}$ for continued performance evaluation. Hence, using the iterative scheme of FIG. 2, process 300 is able to systematically find an optimized user data length assignment $(K^*_{row}, K^*_{col})$ for a product code corresponding to the user data length K provided at step 302.

Figure 3:
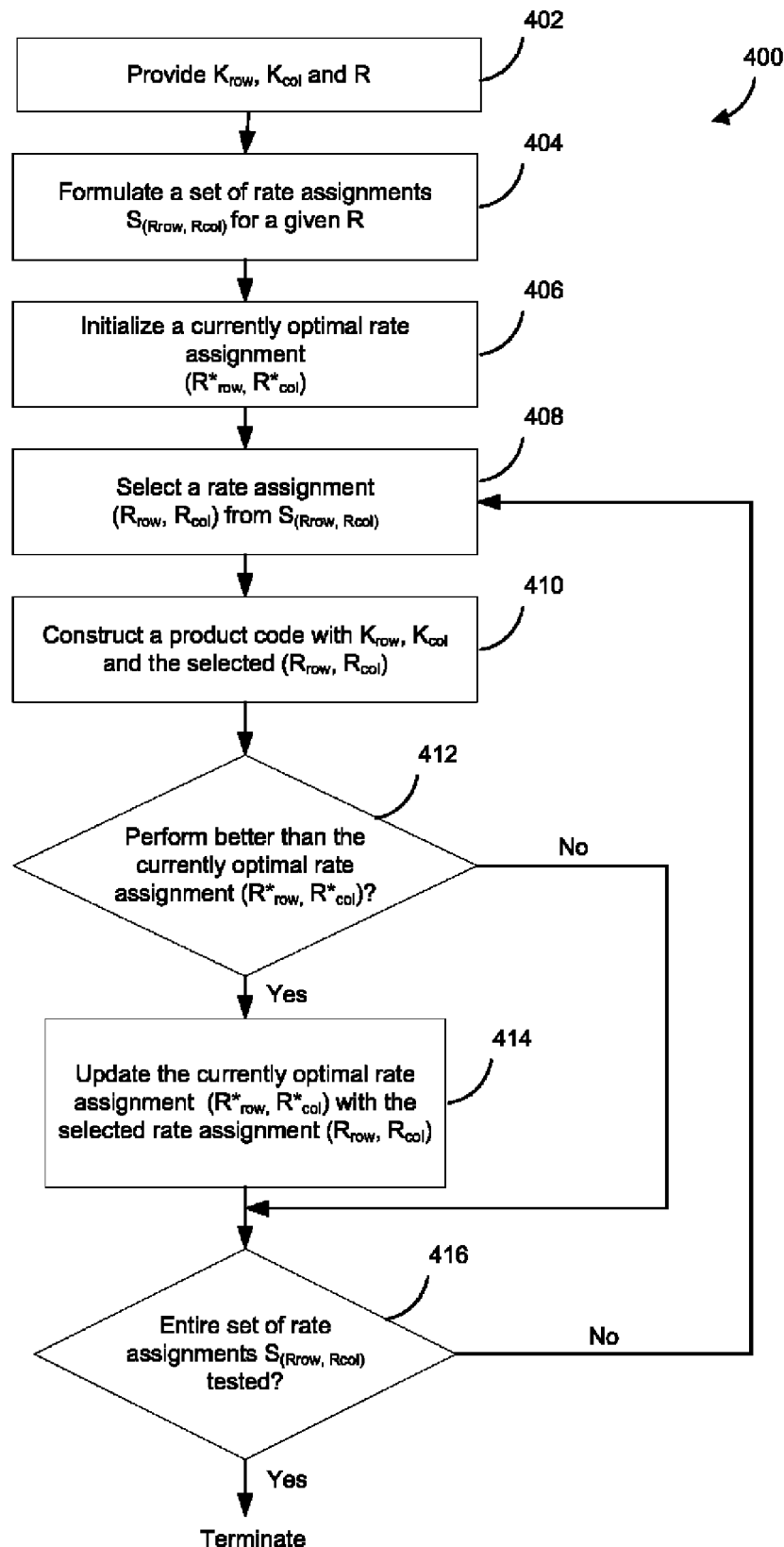
FIG. 3 is a flow diagram showing an illustrative process for optimizing a rate assignment of a product code in accordance with the invention.

FIG. 3 shows a similar process 400 for determining an optimal code rate assignment for a product code structure from a set of code rate assignments formulated for such a structure. At step 402, process 400 receives, as inputs, system code rate R, row user data length $K_{row}$ and column user data length $K_{col}$. Based on the input system code rate R, process 400 is able to formulate, at step 404, a set of rate assignments $S_{(Rrow, Rcol)}$ from which an optimal rate assignment will be chosen. Process 400 accomplishes this by using a procedure similar to that described above with reference to FIG. 2. First, process 400 initializes, at step 406, a currently optimal rate assignment $(R^*_{row}, R^*_{col})$ from $S_{(Rrow, Rcol)}$. Process 400 then selects, at step 408, another rate assignment from $S_{(Rrow, Rcol)}$ formulated at step 404 and utilizes the selected assignment, along with $K_{row}$ and $K_{col}$ provided at step 402, to produce a product code at step 410. At step 412, process 400 compares the performance of the product code with the performance of another product code constructed using the currently optimized rate assignment $(R^*_{row}, R^*_{col})$. If the performance of the product code produced from the assignment selected at step 408 is better than that of the product code constructed from $(R^*_{row}, R^*_{col})$, then $(R^*_{row}, R^*_{col})$ is updated at step 414 to be the same as the selected rate assignment, and process 400 proceeds to step 416. Alternatively, if the performance of the product code constructed from $(R^*_{row}, R^*_{col})$ is better, process 400 proceeds to step 416 without updating $(R^*_{row}, R^*_{col})$. At step 416, process 400 determines if every rate assignment of $S_{(Rrow, Rcol)}$ has been tested. If that is true, process 400 terminates. Otherwise, process 400 iterates to step 408 to select a different rate assignment from $S_{(Rrow, Rcol)}$ for continued evaluation. After process 400 terminates, an optimized $(R^*_{row}, R^*_{col})$ will be determined for a product code corresponding to the system data rate R provided at step 402.

Figure 4:
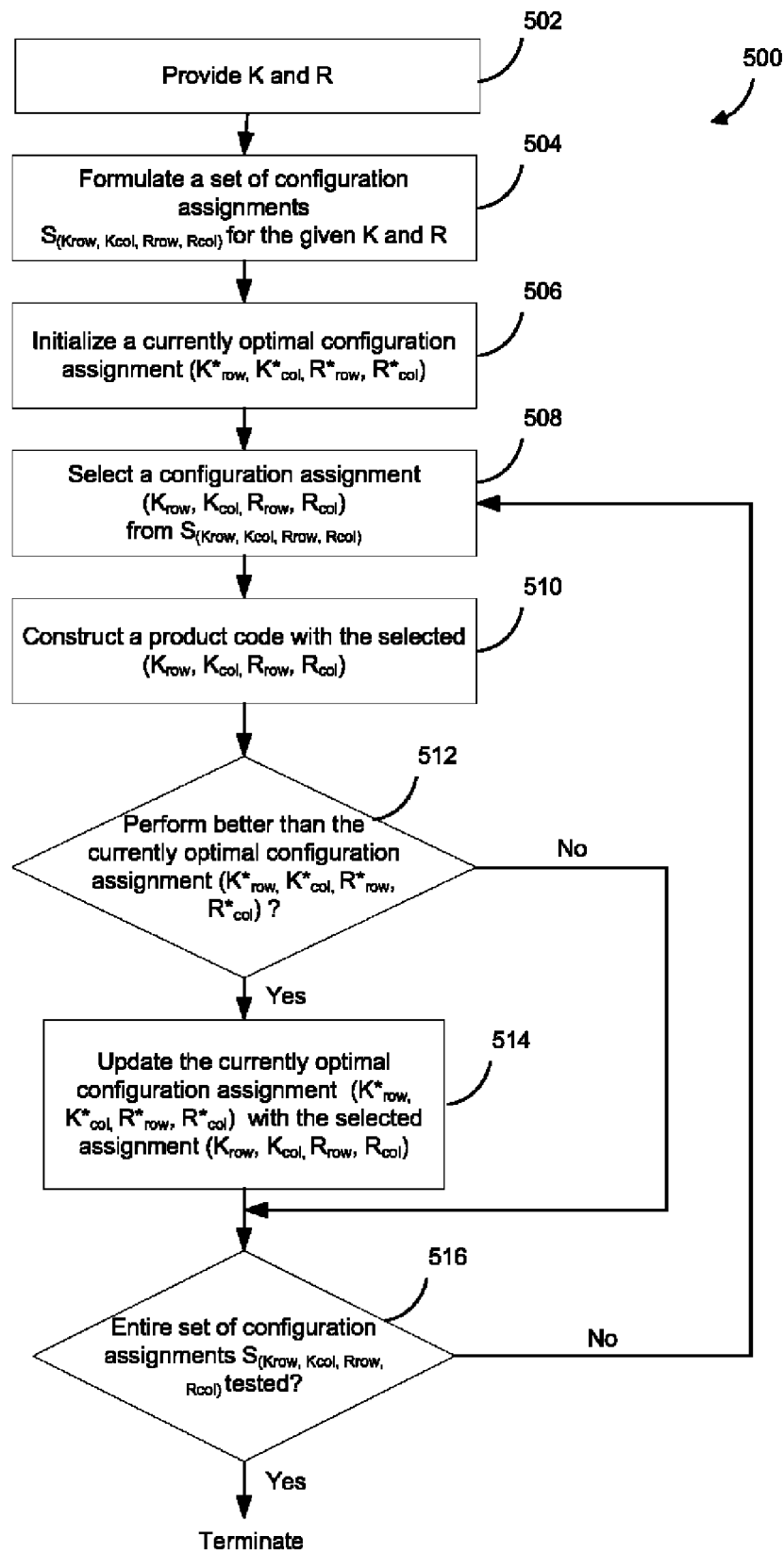
FIG. 4 is a flow diagram showing an illustrative process for optimizing a configuration assignment of a product code in accordance with the invention.

FIG. 4 shows a process 500 for determining an optimized configuration assignment of a product code structure when a system rate R and a data length K are specified, for example, at step 502 of process 500. Based on the received information, process 500 is able to formulate, at step 504, a set of configuration assignments $S_{(Krow, Kcol, Rrow, Rcol)}$ from which an optimal configuration assignment will be chosen. Process 500 accomplishes this by using a procedure similar to the procedure described above with reference to FIGS. 2 and 3. First, process 500 initializes, at step 506, a currently optimal configuration assignment $(K^*_{row}, K^*_{col}, R^*_{row}, R^*_{col})$ from $S_{(Krow, Kcol, Rrow, Rcol)}$. Process 500 then selects, at step 508, another configuration assignment from $S_{(Krow, Kcol, Rrow, Rcol)}$ and utilizes the selected assignment to produce a product code at step 510. At step 512, process 500 compares the performance of the product code with the performance of another product code constructed using the currently optimized configuration assignment $(K^*_{row}, K^*_{col}, R^*_{row}, R^*_{col})$. If the performance of the product code produced from the assignment selected at step 508 is better than that of the product code constructed from $(K^*_{row}, K^*_{col}, R^*_{row}, R^*_{col})$, then $(K^*_{row}, K^*_{col}, R^*_{row}, R^*_{col})$ is updated at step 514 to be the same as the selected configuration assignment, and process 500 proceeds to step 516. Alternatively, if the performance of the product code constructed from $(K^*_{row}, K^*_{col}, R^*_{row}, R^*_{col})$ is better, process 500 proceeds to step 516 without updating $(K^*_{row}, K^*_{col}, R^*_{row}, R^*_{col})$. At step 516, process 500 determines if every configuration assignment of $S_{(Krow, Kcol, Rrow, Rcol)}$ has been tested. If that is true, process 500 terminates. Otherwise, process 500 iterates to step 508 to select another configuration assignment from $S_{(Krow, Kcol, Rrow, Rcol)}$ for continued performance evaluation. Therefore, using the iterative scheme of FIG. 5, process 500 is able to find an optimized configuration assignment $(K^*_{row}, K^*_{col}, R^*_{row}, R^*_{col})$ for a product code corresponding to the user data length K and system code rate R provided at step 502. It will be noted that approaches other than the iterative schemes described herein (e.g., in FIGS. 2-7 and the corresponding description) can be used in various embodiments of the invention. For instance, various approaches can be used to find a locally optimal solution, such as hill-climbing algorithms. Although such approaches can converge on a solution more quickly than an iterative scheme, the solution may be only locally, as opposed to globally, optimal.

Figure 5:
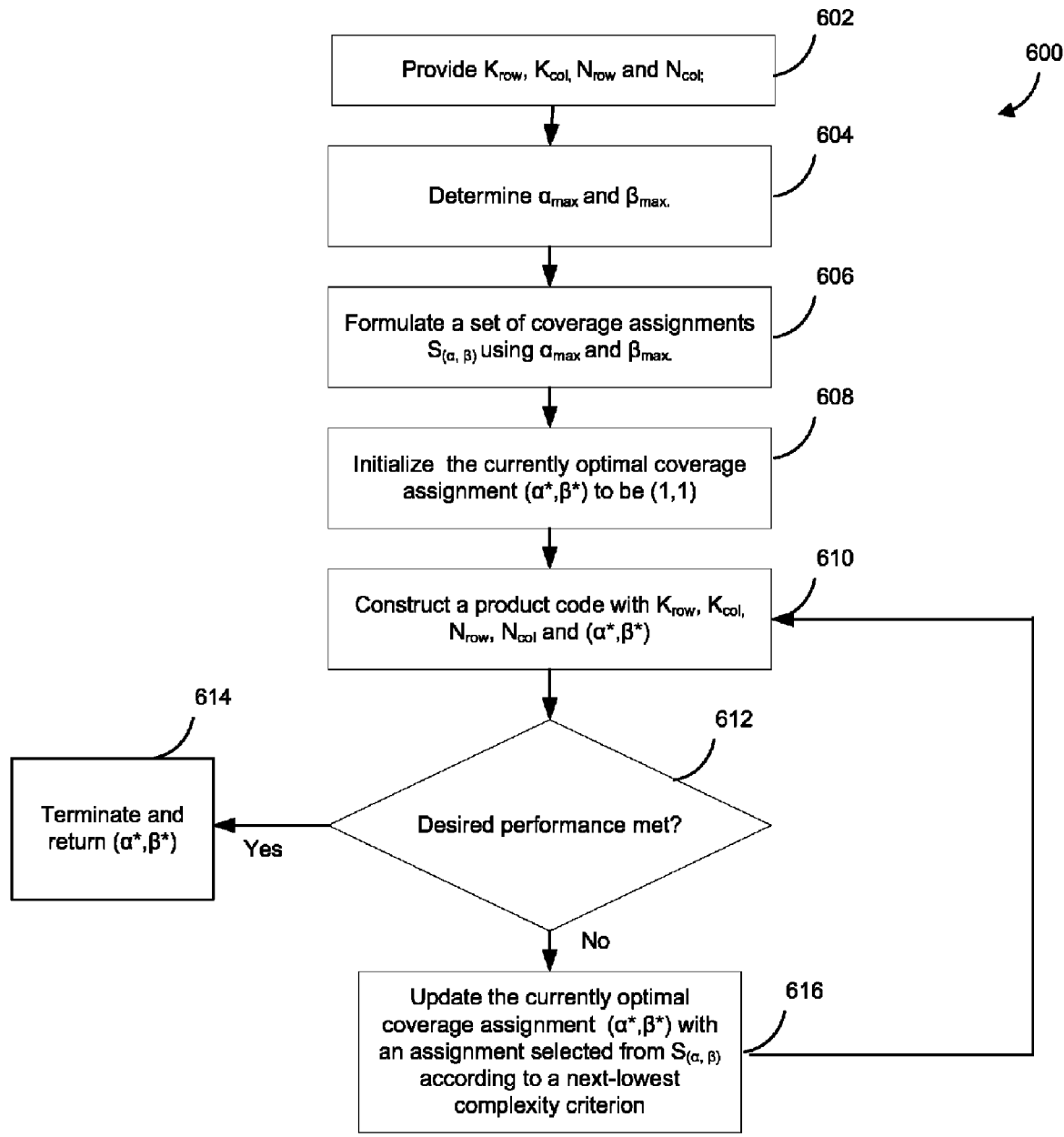
FIG. 5 is a flow diagram showing an illustrative process for optimizing a coverage assignment of a product code in accordance with the invention.

According to yet another embodiment of the present invention, FIG. 5 provides an illustrative process 600 for determining a coverage assignment of a product code to achieve a desired level of error-correction performance with optimized implementation complexity. Typically, a product code is only able to achieve maximum error protection with maximum implementation complexity. However, in many instances, a performance level that is lower than maximum is sufficient for a particular data transmission. Process 600 provides an approach for determining a coverage assignment of a product code that allows a target level of error protection to be satisfied at a minimal implementation complexity.

As shown in FIG. 5, $K_{row}$, $K_{col}$, $N_{row}$, and $N_{col}$ of a product code are specified at step 602 of process 600. Based on the received information, process 600 is able to formulate a set of coverage assignments $S_{(\alpha, \beta)}$ from which the coverage assignment having desired performance with minimized complexity will be chosen. In one embodiment, process 600 formulates $S_{(\alpha, \beta)}$ by first determining, at step 604, a maximum column codeword coverage value $\alpha_{max}$ and a maximum row codeword coverage value $\beta_{max}$ of the product code. These maximum coverage values typically result in optimal error-correction performance, but often require maximum implementation complexity as well. At step 606, process 600 proceeds to formulate $S_{(\alpha, \beta)}$ using $(\beta_{max}, \alpha_{max})$ determined at step 604. For example, $S_{(\alpha, \beta)}$ may consist of one or more coverage assignments $(\alpha, \beta)$ such that $1 \leq \alpha \leq \alpha_{max}$ and $1 \leq \beta \leq \beta_{max}$, and $\alpha$ and $\beta$ are both integer values. In particular, $S_{(\alpha, \beta)}$ may be the set $\{(1, 1); (1, 2); \ldots (1, \alpha_{max}); (2, 1); (2, 2); \ldots (2, \alpha_{max}); \ldots (\beta_{max}, 1); (\beta_{max}, 2); \ldots (\beta_{max}, \alpha_{max})\}$.

Process 600 then initializes a currently optimal coverage assignment ($\alpha^*, \beta^*$) to be an assignment in $S_{(\alpha, \beta)}$ that achieves the lowest complexity in the resulting product code. For example, ($\alpha^*, \beta^*$) may be initialized to (1,1) at step 608. Process 600 subsequently produces a product code at step 610 using the currently optimal coverage assignment ($\alpha^*, \beta^*$) from step 608, along with parameters $K_{row}, K_{col}, N_{row}$, and $N_{col}$ provided at step 602. At step 612, if process 600 determines that a desired performance level is met by this product code, process 600 terminates at step 614 and returns the currently optimal coverage assignment ($\alpha^*, \beta^*$). Otherwise, ($\alpha^*, \beta^*$) is updated at step 616 to be the same as another coverage assignment in $S_{(\alpha, \beta)}$ selected according to a lowest-complexity criterion. Process 600 then iterates to step 610. Process 600 then continues iterating through steps 610, 612 and 616, testing successive values for ($\alpha^*, \beta^*$) until the desired performance level is met. Hence, using the iterative scheme of FIG. 6, process 600 is able to systematically determine a coverage assignment ($\alpha^*, \beta^*$) that is able to satisfy a specified performance level while achieving a minimized complexity.

According to yet another embodiment of the present invention, FIG. 6 illustrates an exemplary optimization process 200 for jointly optimizing configuration and coverage assignments of a product code. Optimization process 200 initiates by allowing a user to provide, at step 202, a user data length K. Based on this information, process 200 is able to determine optimized configuration and coverage assignments for encoding the user data such that the resulting product code is able to achieve a desired level of error-correction performance while achieving a minimized implementation complexity. Process 200 accomplishes this by first determining, at step 204, whether a system code rate R is specified for the product code. If a system code is not provided, process 200 executes, at step 206, joint optimization of coverage and configuration assignments under one or more possible system code rates associated with the product code. Alternatively, if the system rate R is provided, process 200 executes, at step 208, joint optimization of coverage and configuration assignments only under the specified rate R. Details regarding these joint optimization techniques will be described below.

FIG. 7 provides a process 700 for implementing an exemplary joint optimization technique described above with reference to FIG. 6. At step 702, process 700 determines an optimized coverage assignment ($\alpha^*, \beta^*$) for a product code of a specified data length k using, for example, process 600 of FIG. 5. On first entry into process 700, initial values for $K^*_{row}, K^*_{col}, R^*_{row}, R^*_{col}$ are chosen using any suitable method. For instance, they can be chosen arbitrarily, based on any suitable selection criteria, based on data obtained from previous optimizations or other processes, or any suitable combination thereof. It will be noted that if concepts illustrated in FIG. 7 are used with an algorithm that finds a locally optimal solution (e.g., hill climbing) instead of a globally optimal solution, careful selection of initial values for $K^*_{row}, K^*_{col}, R^*_{row}, R^*_{col}$ can increase the likelihood of finding an acceptable solution. In such a case, process 700 may have to be run several times, each with a different set of initial values for $K^*_{row}, K^*_{col}, R^*_{row}, R^*_{col}$, before an acceptable solution is found.

Process 700 then proceeds to step 704 to determine an optimized configuration assignment ($K^*_{row}, K^*_{col}, R^*_{row}, R^*_{col}$) for the product code using, for example, process 500 of FIG. 4. System rate R of process 500 may be a user-specified rate or a rate selected from a set of one or more possible rates for transmitting the product code. A product code is subsequently constructed at step 706 using the optimized configuration assignment ($K^*_{row}, K^*_{col}, R^*_{row}, R^*_{col}$) and the optimized coverage assignment ($\alpha^*, \beta^*$). If process 700 determines, at step 708, that the product code meets a desired error-correction performance level during data transmission, then process 700 terminates at step 710 and returns the optimized coverage and configuration assignments. Otherwise, process 700 proceeds to step 712 to determine if all system rates have been tested. If that is indeed the case, process 700 iterates to step 702 to try another coverage assignment; otherwise, process 700 iterates to step 704.

In an illustrative example of the operation of process 700, step 702 can begin with ($\alpha^*, \beta^*$) being set to ($\alpha^*=1, \beta^*=1$) in step 702 and optimizing ($K^*_{row}, K^*_{col}, R^*_{row}, R^*_{col}$) based on those initial values, as described above. A product code can be generated for those values of ($\alpha^*, \beta^*, K^*_{row}, K^*_{col}, R^*_{row}, R^*_{col}$) at step 706, and that resulting code can be tested at step 708. If the desired performance criterion is not met, a new selection for ($\alpha^*, \beta^*$) can be made in step 702 in a way that minimizes the increase in complexity relative to the last selection for ($\alpha^*, \beta^*$). For instance, the new selection can be ($\alpha^*=2, \beta^*=1$), which can be used in step 704 to determine optimal values for ($K^*_{row}, K^*_{col}, R^*_{row}, R^*_{col}$) in step 704. The new set of values of ($\alpha^*, \beta^*, K^*_{row}, K^*_{col}, R^*_{row}, R^*_{col}$) can be used to generate another product code at step 706. If the performance of that product code still does not meet the criterion for desired performance, the process can be repeated for yet another selection of ($\alpha^*, \beta^*$), which can again be made in a way that minimizes the increase in complexity relative to the last selection for ($\alpha^*, \beta^*$). For instance, the new selection can be ($\alpha^*=2, \beta^*=2$). The process can continue in this fashion and can terminate as soon as the criterion for desired performance is met, thereby resulting in a solution that yields acceptable performance with the lowest possible degree of complexity.

Systems and methods have been shown for the joint optimization of a user data length assignment, a system rate assignment, a configuration assignment and/or a coverage assignment in association with a two-dimensional product code. These optimization techniques may also be generalized to error-correction codes of higher dimensions. Furthermore, these techniques may be extended to include other criteria for optimizing the one or more product code assignments in addition to, or in place of, the criteria described above with reference to FIGS. 1-7.

Referring now to FIGS. 8A-8G, various exemplary implementations of the present invention are shown.

Figure 8B:
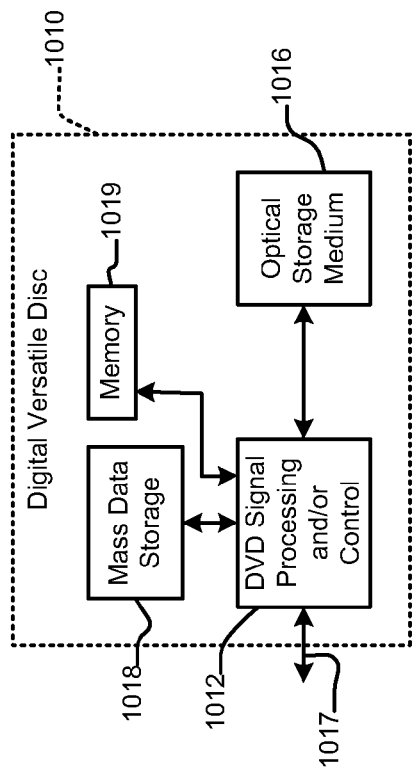
FIG. 8B is a block diagram of an exemplary digital versatile disc that employs the disclosed technology.
Figure 8A:
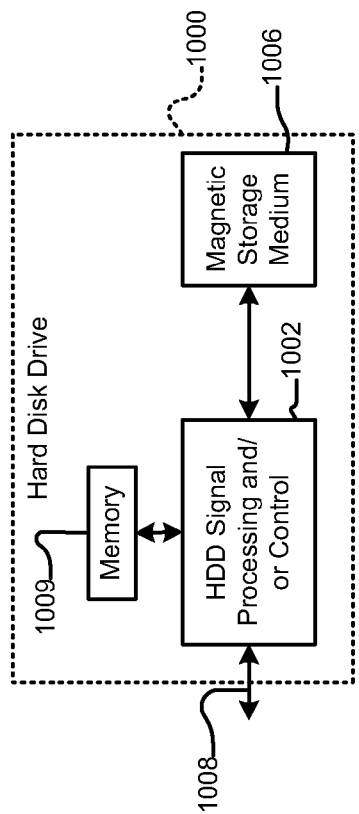
FIG. 8A is a block diagram of an exemplary hard disk drive that employs the disclosed technology.

Referring now to FIG. 8A, the present invention can be implemented in a hard disk drive 1000. The present invention may implement either or both signal processing and/or control circuits, which are generally identified in FIG. 8A at 1002. In some implementations, the signal processing and/or control circuit 1002 and/or other circuits (not shown) in the HDD 1000 may process data, perform coding and/or encryption, perform calculations, and/or format data that is output to and/or received from a magnetic storage medium 1006.

The HDD 1000 may communicate with a host device (not shown) such as a computer, mobile computing devices such as personal digital assistants, cellular phones, media or MP3 players and the like, and/or other devices via one or more wired or wireless communication links 1008. The HDD 1000 may be connected to memory 1009 such as random access memory (RAM), low latency nonvolatile memory such as flash memory, read only memory (ROM) and/or other suitable electronic data storage.

Referring now to FIG. 8B, the present invention can be implemented in a digital versatile disc (DVD) drive 1010. The present invention may implement either or both signal processing and/or control circuits, which are generally identified in FIG. 8B at 1012, and/or mass data storage of the DVD drive 1010. The signal processing and/or control circuit 1012 and/or other circuits (not shown) in the DVD 1010 may process data, perform coding and/or encryption, perform calculations, and/or format data that is read from and/or data written to an optical storage medium 1016. In some implementations, the signal processing and/or control circuit 1012 and/or other circuits (not shown) in the DVD 1010 can also perform other functions such as encoding and/or decoding and/or any other signal processing functions associated with a DVD drive.

The DVD drive 1010 may communicate with an output device (not shown) such as a computer, television or other device via one or more wired or wireless communication links 1017. The DVD 1010 may communicate with mass data storage 1018 that stores data in a nonvolatile manner. The mass data storage 1018 may include a hard disk drive (HDD). The HDD may have the configuration shown in FIG. 8A. The HDD may be a mini HDD that includes one or more platters having a diameter that is smaller than approximately 1.8". The DVD 1010 may be connected to memory 1019 such as RAM, ROM, low latency nonvolatile memory such as flash memory and/or other suitable electronic data storage.

Figure 8D:
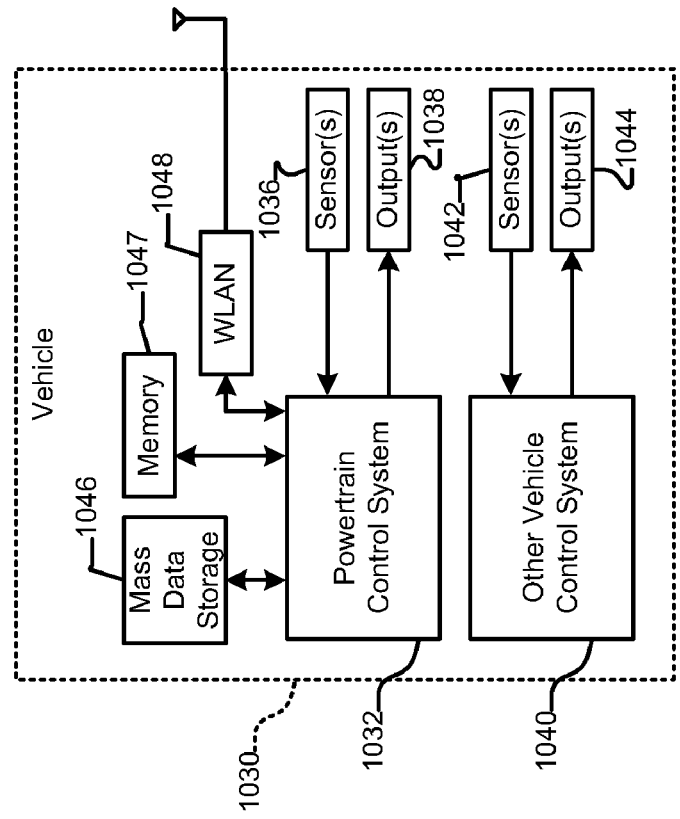
FIG. 8D is a block diagram of an exemplary vehicle that employs the disclosed technology.
Figure 8C:
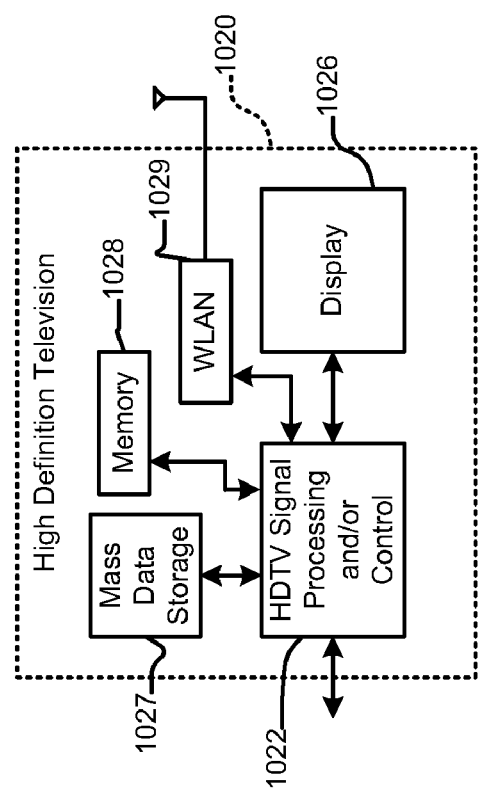
FIG. 8C is a block diagram of an exemplary high definition television that employs the disclosed technology.

Referring now to FIG. 8C, the present invention can be implemented in a high definition television (HDTV) 1020. The present invention may implement either or both signal processing and/or control circuits, which are generally identified in FIG. 8C at 1022, a WLAN interface and/or mass data storage of the HDTV 1020. The HDTV 1020 receives HDTV input signals in either a wired or wireless format and generates HDTV output signals for a display 1026. In some implementations, signal processing circuit and/or control circuit 1022 and/or other circuits (not shown) of the HDTV 1020 may process data, perform coding and/or encryption, perform calculations, format data and/or perform any other type of HDTV processing that may be required.

The HDTV 1020 may communicate with mass data storage 1027 that stores data in a nonvolatile manner such as optical and/or magnetic storage devices. At least one HDD may have the configuration shown in FIG. 8A and/or at least one DVD may have the configuration shown in FIG. 8B. The HDD may be a mini HDD that includes one or more platters having a diameter that is smaller than approximately 1.8". The HDTV 1020 may be connected to memory 1028 such as RAM, ROM, low latency nonvolatile memory such as flash memory and/or other suitable electronic data storage. The HDTV 1020 also may support connections with a WLAN via a WLAN network interface 1029.

Referring now to FIG. 8D, the present invention implements a control system of a vehicle 1030, a WLAN interface and/or mass data storage of the vehicle control system. In some implementations, the present invention may implement a powertrain control system 1032 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 1040 of the vehicle 1030. The control system 1040 may likewise receive signals from input sensors 1042 and/or output control signals to one or more output devices 1044. In some implementations, the control system 1040 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 1032 may communicate with mass data storage 1046 that stores data in a nonvolatile manner. The mass data storage 1046 may include optical and/or magnetic storage devices for example hard disk drives HDD and/or DVDs. At least one HDD may have the configuration shown in FIG. 8A and/or at least one DVD may have the configuration shown in FIG. 8B. The HDD may be a mini HDD that includes one or more platters having a diameter that is smaller than approximately 1.8". The powertrain control system 1032 may be connected to memory 1047 such as RAM, ROM, low latency nonvolatile memory such as flash memory and/or other suitable electronic data storage. The powertrain control system 1032 also may support connections with a WLAN via a WLAN network interface 1048. The control system 1040 may also include mass data storage, memory and/or a WLAN interface (all not shown).

Figure 8E:
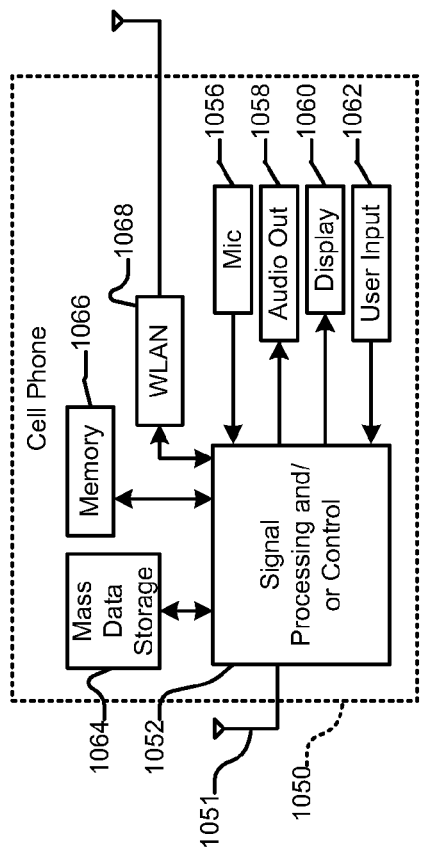
FIG. 8E is a block diagram of an exemplary cell phone that employs the disclosed technology.

Referring now to FIG. 8E, the present invention can be implemented in a cellular phone 1050 that may include a cellular antenna 1051. The present invention may implement either or both signal processing and/or control circuits, which are generally identified in FIG. 8E at 1052, a WLAN interface and/or mass data storage of the cellular phone 1050. In some implementations, the cellular phone 1050 includes a microphone 1056, an audio output 1058 such as a speaker and/or audio output jack, a display 1060 and/or an input device 1062 such as a keypad, pointing device, voice actuation and/or other input device. The signal processing and/or control circuits 1052 and/or other circuits (not shown) in the cellular phone 1050 may process data, perform coding and/or encryption, perform calculations, format data and/or perform other cellular phone functions.

The cellular phone 1050 may communicate with mass data storage 1064 that stores data in a nonvolatile manner such as optical and/or magnetic storage devices for example hard disk drives HDD and/or DVDs. At least one HDD may have the configuration shown in FIG. 8A and/or at least one DVD may have the configuration shown in FIG. 8B. The HDD may be a mini HDD that includes one or more platters having a diameter that is smaller than approximately 1.8". The cellular phone 1050 may be connected to memory 1066 such as RAM, ROM, low latency nonvolatile memory such as flash memory and/or other suitable electronic data storage. The cellular phone 1050 also may support connections with a WLAN via a WLAN network interface 1068.

Figure 8F:
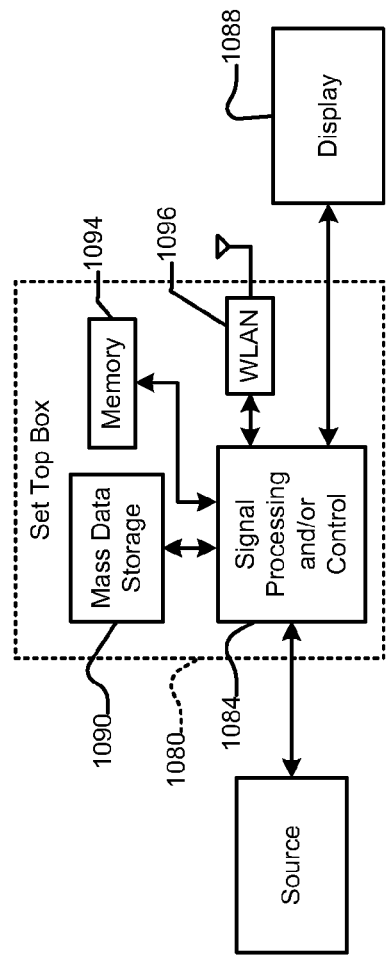
FIG. 8F is a block diagram of an exemplary set top box that employs the disclosed technology.

Referring now to FIG. 8F, the present invention can be implemented in a set top box 1080. The present invention may implement either or both signal processing and/or control circuits, which are generally identified in FIG. 8F at 1084, a WLAN interface and/or mass data storage of the set top box 1080. The set top box 1080 receives signals from a source such as a broadband source and outputs standard and/or high definition audio/video signals suitable for a display 1088 such as a television and/or monitor and/or other video and/or audio output devices. The signal processing and/or control circuits 1084 and/or other circuits (not shown) of the set top box 1080 may process data, perform coding and/or encryption, perform calculations, format data and/or perform any other set top box function.

The set top box 1080 may communicate with mass data storage 1090 that stores data in a nonvolatile manner. The mass data storage 1090 may include optical and/or magnetic storage devices for example hard disk drives HDD and/or DVDs. At least one HDD may have the configuration shown in FIG. 8A and/or at least one DVD may have the configuration shown in FIG. 8B. The HDD may be a mini HDD that includes one or more platters having a diameter that is smaller than approximately 1.8". The set top box 1080 may be connected to memory 1094 such as RAM, ROM, low latency nonvolatile memory such as flash memory and/or other suitable electronic data storage. The set top box 1080 also may support connections with a WLAN via a WLAN network interface 1096.

Figure 8H:
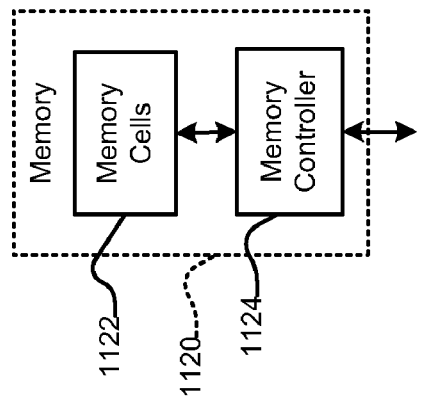
FIG. 8H is a block diagram of an exemplary memory that employs the disclosed technology.
Figure 8G:
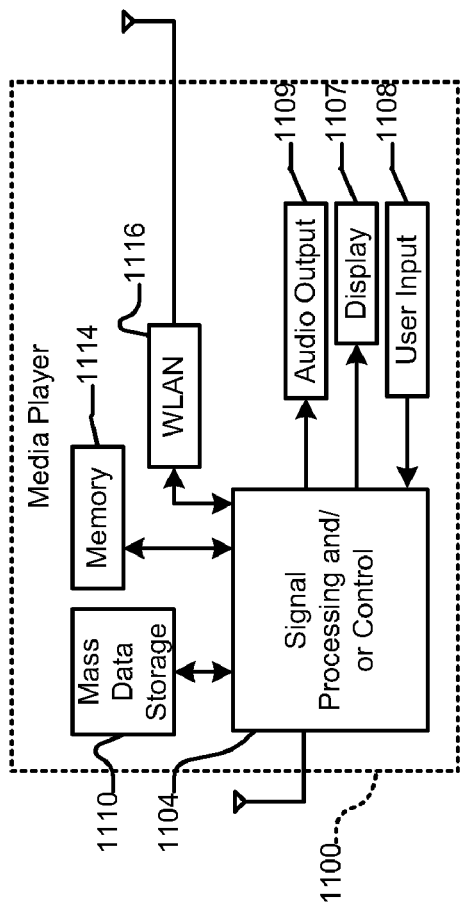
FIG. 8G is a block diagram of an exemplary media player that employs the disclosed technology.

Referring now to FIG. 8G, the present invention can be implemented in a media player 1100. The present invention may implement either or both signal processing and/or control circuits, which are generally identified in FIG. 8G at 1104, a WLAN interface and/or mass data storage of the media player 1100. In some implementations, the media player 1100 includes a display 1107 and/or a user input 1108 such as a keypad, touchpad and the like. In some implementations, the media player 1100 may employ a graphical user interface (GUI) that typically employs menus, drop down menus, icons and/or a point-and-click interface via the display 1107 and/or user input 1108. The media player 1100 further includes an audio output 1109 such as a speaker and/or audio output jack. The signal processing and/or control circuits 1104 and/or other circuits (not shown) of the media player 1100 may process data, perform coding and/or encryption, perform calculations, format data and/or perform any other media player function.

The media player 1100 may communicate with mass data storage 1110 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 8A and/or at least one DVD may have the configuration shown in FIG. 8B. The HDD may be a mini HDD that includes one or more platters having a diameter that is smaller than approximately 1.8". The media player 1100 may be connected to memory 1114 such as RAM, ROM, low latency nonvolatile memory such as flash memory and/or other suitable electronic data storage. The media player 1100 also may support connections with a WLAN via a WLAN network interface 1116. Still other implementations in addition to those described above are contemplated.

Referring now to FIG. 8H, the present invention can be implemented in a memory 1120, which may be used as any one or more of memories 1009, 1019, 1028, 1047, 1066, 1094, and 1114 of FIGS. 8A-8G. Memory 1120 can include memory cells 1122, which can include cells of any suitable type, such as RAM, ROM, low latency nonvolatile memory such as flash memory, any other suitable electronic data storage, or any suitable combinations thereof. Memory cells 1122 can be used to store any suitable data, such as user data 152, encoded data 100, or both. Memory 1120 can also include memory controller 1124, which can be used to facilitate read and write operations with memory cells 1122. For example, if memory cells 1122 include flash memory cells, memory controller 1124 can be a flash memory controller, or include circuitry that is suitable for operation with flash memory. Memory controller 1124 can be operable to read and write data to and from memory cells 1122, perform data decoding, perform data encoding, any other suitable function, or any suitable combinations thereof.

In accordance with embodiments of the invention, memory controller 1124 can implement any one or more of the methods illustrated in FIGS. 2-7. In accordance with embodiments of the invention, memory controller 1124 can store multiple code configuration assignments, along with encoders, decoders, or both that can correspond to those stored configuration assignments.

A system on which memory 1120 resides (e.g., any one of the systems illustrated in FIGS. 8A-8G) can be operable to choose a desired or optimal configuration assignment based on various factors, which may include format requirements (e.g., R, K, or both), error rate requirements, the particular application being used, any other suitable factor, or any suitable combination thereof. The optimization can be performed using on-chip firmware residing on circuitry in the system, using off-chip programs that reside on circuitry external to the system, or any suitable combination thereof. A configuration assignment that results from an optimization process of the invention can be used as a programmable parameter to configure encoder circuitry, decoder circuitry, or both in memory controller 1124. If the system in which memory 1120 is used can support multiple applications of different types (e.g., storing system code and storing user data, either simultaneously or at different times), a different optimization process can be applied for each application, resulting in a different configuration assignment for each application.

Thus it is seen that joint optimization techniques can be applied to determine various parameters of a product code structure. One skilled in the art will appreciate that the invention can be practiced by other than the described embodiments, which are presented for purposes of illustration and not of limitation, and the present invention is limited only by the claims which follow.

What is claimed is:

1. A method of optimizing a coverage assignment associated with an error-correction product code, comprising:
    receiving at least one input;
    generating a plurality of candidate coverage assignments for the error-correction product code, wherein each coverage assignment comprises at least a first coverage value and a second coverage value;
    iteratively selecting coverage assignments from the plurality of candidate coverage assignments; and
    for each selected coverage assignment:
        generating a candidate error-correction product code based on the selected coverage assignment and the at least one input,
        encoding data based on the generated candidate error-correction product code,
        comparing a performance level of the encoded data to a desired performance level, and
        if the desired performance level is satisfied, returning the selected coverage assignment and terminating the iterative selection of coverage assignments from the plurality of candidate coverage assignments.

2. The method of claim 1, wherein the at least one input comprises one of a first user data length, a second user data length, a first code length and a second code length.

3. The method of claim 2, wherein the first user data length is a row user data length and the second user data length is a column data length.

4. The method of claim 2, wherein the first code length is a code row length and the second code length is a code column length.

5. The method of claim 1, wherein the first coverage value is a row coverage value and the second coverage value is a column coverage value.

6. The method of claim 1, wherein the plurality of candidate coverage assignments are generated based on at least one of a maximum row codeword coverage value and a maximum column codeword coverage value.

7. The method of claim 1, wherein the iterative selection of coverage assignments from the plurality of candidate coverage assignments is based on a lowest-complexity criterion.

8. The method of claim 1, wherein the performance level of the encoded data is evaluated based on an error rate corresponding to a criterion selected from the group consisting of: a signal-to-noise ratio, defect detection capability, defect correction capability, erasure correction capability, and speed of convergence.

9. The method of claim 1, wherein each coverage assignment further includes a third coverage value corresponding to a third dimension of the error-correction product code.

10. The method of claim 1, wherein the error-correction product code comprises more than two dimensions.

11. The method of claim 1, further comprising:
determining one or more code rates;
iteratively selecting at least one code rate from the one or more code rates; and
for each selected code rate:
optimizing a configuration assignment based on the selected code rate, wherein the configuration assignment comprises a plurality of code parameters including at least one of a first user data length, a second user data length, a first data rate and a second data rate,
generating an error-correction product code using the returned coverage assignment and the configuration assignment,
comparing a performance level of the error-correction product code with the desired performance level, and
if the desired performance level is satisfied, returning the optimal configuration assignment and terminating the iterative selection of code rate from the one or more code rates.

12. The method of claim 1, wherein:
the returned coverage assignment is used to encode data produced by an application; and
the desired performance level is a required symbol error rate for the application.

13. A method of optimizing a configuration assignment associated with an error-correction product code, comprising:
receiving at least one input;
formulating a plurality of candidate configuration assignments for the error-correction product code based on the at least one input, wherein each configuration assignment comprises at least one of a first user data length, a second user data length, a first data rate and a second data rate;
initializing a currently optimal configuration assignment;
iteratively selecting configuration assignments from the plurality of candidate configuration assignments; and
for each selected configuration assignment:
generating a first error-correction product code based on the selected configuration assignment,
encoding data based on the generated first error-correction product code,
comparing a performance of the encoded data based on the generated first error-correction product code to a performance of a second error-correction product code generated from the currently optimal configuration assignment, and
if the performance of the encoded data based on the generated first error-correction product code is better than the performance of the second error correction product code, setting the currently optimal configuration assignment to the selected configuration assignment.

14. The method of claim 13, further comprising returning the currently optimal configuration assignment when the iterative selection of configuration assignments from the plurality of candidate configuration assignments is terminated.

15. The method of claim 13, wherein the at least one input comprises one of a user data length and a code rate.

16. The method of claim 13, wherein the first user data length is a row user data length and a second user data length is a column user data length.

17. The method of claim 13, wherein the first data rate is a row data rate and the second data rate is a column data rate.

18. The method of claim 13, wherein the currently optimal configuration assignment is initialized from the plurality of candidate configuration assignments.

19. The method of claim 13, wherein each configuration assignment further includes a third user data length and a third data rate corresponding to a third error-correction product code dimension.

20. The method of claim 13, wherein the performance of at least one of the encoded data based on the generated first error-correction product code and second error-correction product code is evaluated based on an error rate corresponding to a criterion selected from the group consisting of: a signal-to-noise ratio, defect detection capability, defect correction capability, erasure correction capability, and speed of convergence.

21. A system comprising:
a plurality of memory cells;
a memory controller coupled to the plurality of memory cells, the memory controller being operable to encode data read from the plurality of memory cells using a product code configuration assignment; and
circuitry coupled to the memory controller, the circuitry being operable to optimize at least one parameter of the product code and transmit the at least one parameter to the memory controller for use in the data encoding.

22. The system of claim 21 wherein the at least one parameter of the product code includes a parameter selected from the group consisting of: a first user data length, a second user data length, a first data rate, a second data rate, a first coverage value, and a second coverage value.

23. The system of claim 21 wherein the circuitry is selected from the group consisting of: circuitry residing on the system and circuitry external to the system.

* * * * *